United States Patent [19]

Naruse et al.

[11] Patent Number: 5,192,680
[45] Date of Patent: Mar. 9, 1993

[54] METHOD FOR PRODUCING SEMICONDUCTOR DEVICE

[75] Inventors: Yasuhiro Naruse, Isehara; Genzo Momma, Tokyo; Hiroshi Yuzurihara, Hiratsuka, all of Japan

[73] Assignee: Canon Kabushiki Kaisha, Tokyo, Japan

[21] Appl. No.: 360,341

[22] Filed: Jun. 2, 1989

[30] Foreign Application Priority Data

Jun. 6, 1988 [JP] Japan .................................. 63-138866
Feb. 9, 1989 [JP] Japan .................................... 1-28686

[51] Int. Cl.⁵ ........................................ H01L 21/205
[52] U.S. Cl. ........................................ 437/81; 437/89; 437/103
[58] Field of Search .................. 437/89, 90, 81, 102, 437/103

[56] References Cited

U.S. PATENT DOCUMENTS 4,131,496 12/1978 Weitzel et al. ......................... 437/90
4,141,765 2/1979 Druminski et al. ..................... 437/90

OTHER PUBLICATIONS

Ueda et al., "A New Vertical Power MOSFET Structure With Extremely Reduced On-Resistance," IEEE Trans. on Electron Devices, vol. ED-32, No. 1, Jan. 1985.
Wolf et al., *Silicon Processing for the VLSI Era*, vol. 1—*Process Technology*, Lattice Press, 1986, pp. 1–5.

*Primary Examiner*—Mary Wilczewski
*Attorney, Agent, or Firm*—Fitzpatrick, Cella, Harper & Scinto

[57] ABSTRACT

A method for producing a semiconductor device containing steps of forming a stepped pattern on the surface of a semiconductor substrate and forming a gaseous grown crystal layer thereon, which comprises positioning an alignment pattern (for example 6c) included in the first-mentioned pattern diagonally with respect to an in-plane direction of faster pattern growth in said gaseous crystal growth.

3 Claims, 3 Drawing Sheets

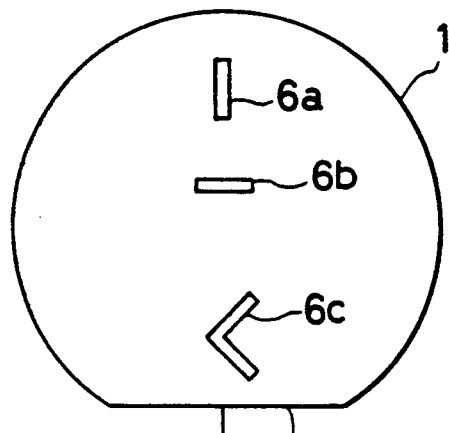
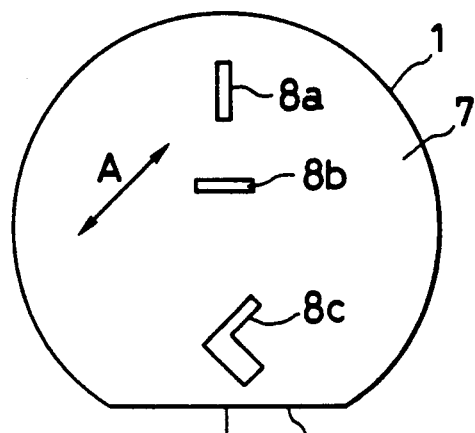
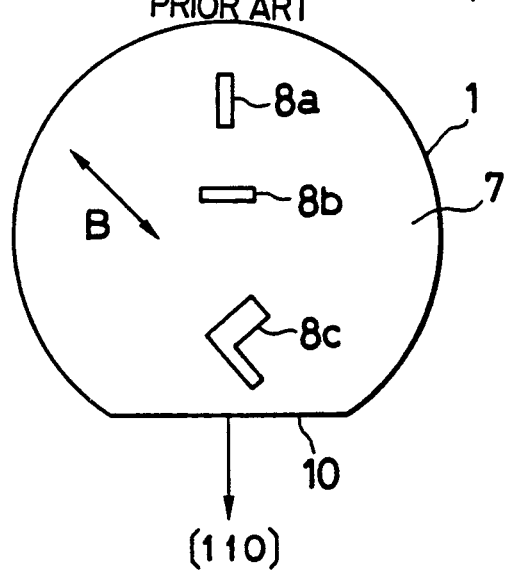

METHOD FOR PRODUCING SEMICONDUCTOR DEVICE

BACKGROUND OF THE INVENTION

1. Field of the Invention

The present invention relates to a method for producing a semiconductor device, and more particularly to such method enabling satisfactory alignment of a pattern formed after gaseous crystal growth with a pattern formed before gaseous crystal growth.

2. Related Background Art

FIG. 1 shows an example of a stepped pattern formation on a semiconductor substrate.

At first, on a surface with an orientation (100) of a p-type semiconductor (Si) substrate 1 of a specific resistivity of 10–20 Ω·cm, a SiO₂ film 2 of a thickness of 0.5–2.0 μm is formed over the entire area, and a photoresist layer is formed thereon. Then said photoresist layer is patterned to obtain a mask pattern, and the thus exposed portion of the SiO₂ film 2 is removed with HF wet etching, whereby an aperture 3 is formed in the SiO₂ film 2 at a desired position for forming an embedded layer as shown in FIG. 1A.

Then, in order to obtain n-type conductivity, the semiconductor substrate 1 is subjected, in the exposed surface thereof, to doping by implantation of As ions as impurity component, and then to heat treatment in an oxidative atmosphere. The ion implantation is conducted with a dose of $1 \times 10^{14} - 1 \times 10^{16}/cm^2$ and an accelerating voltage of 30–90 keV, while the heat treatment is conducted at a temperature of 900°–1200° C. Thus, as shown in FIG. 1B, the exposed surface of the semiconductor substrate 1 is oxidized as a new SiO₂ film 4, and a high impurity concentration area 5 is formed thereunder.

Then said SiO₂ films 2 and 4 are removed by HF wet etching, whereby, as shown in FIG. 1C, a step 6 is formed on the surface of the semiconductor substrate 1, at the boundary between said high impurity concentration area 5 and the other area.

Subsequently, gaseous crystal growth is conducted over the entire surface, with gasses of SiHCl₃, SiCl₄ or SiH₂Cl₂; a temperature of 950° C.–1150° C., a pressure from atmospheric pressure to 50 Torr and a growth speed of 0.1 to 1.5 μm/min. whereby a gaseous grown crystal layer 7, formed by epitaxial growth, is formed on the semiconductor substrate as shown in FIG. 1D. The surface of said crystal layer has a step 8 corresponding to the step 6 on the surface of said substrate 1.

Therefore, an embedded layer of low resistivity is formed in this manner, composed of the high impurity concentration area 5. Said embedded layer, used for example for reducing the collector resistance of a transistor, is formed with a low resistance and with a conductive type same as that of a crystalline layer formed by gaseous crystal growth on the surface of the semiconductor substrate.

Any process to be applied to the semiconductor substrate having such embedded layer 5 formed therein should be well aligned with the pattern of said embedded layer which corresponds to the pattern of the step 6. Said alignment can be made with reference to the pattern of the step 8 on the surface of the gaseous grown crystal layer, which corresponds to the pattern of the step 6 of the embedded layer 5, said step 6 being formed for the purpose of alignment simultaneously with said embedded layer 5.

The manufacturing process of semiconductor devices as explained above is generally conducted with reference to an orientation flat formed on the semiconductor substrate. The alignment pattern is formed diagonally with respect to a normal line to said orientation flat.

FIG. 2A is a plan view of a state shown in FIG. 1C, and FIGS. 2B and 2C are plan views of a state shown in FIG. 1D.

Conventionally, the orientation flat 10 of a Si substrate 1 is formed as a (110) surface as shown in FIG. 2. There are shown stepped patterns 6a, 6b of a functional part, such as a resistor, a PN junction capacitor, a bipolar transistor or a MOS transistor of a semiconductor device; and a stepped pattern for alignment. Said pattern 6c is L-shaped composed of two linear portions positioned at 45° to the normal line to the orientation flat 10.

In the gaseous crystal growth, the pattern growth is faster in the direction [100] or [010]. The growth speed in either of said two directions becomes larger, depending upon the growth conditions. If the growth speed is larger in a direction A shown in FIG. 2B, with the gaseous growth of the crystal layer 7, the pattern width of the functional part scarcely changes so that the steps 8a, 8b formed on the surface of the crystal layer 7 at the end of the aforementioned steps 6a, 6b. However, the width of one of linear portions of the alignment pattern increases gradually, so that the step 8c formed on the surface of said crystal layer 7 does not exactly correspond to said step 6c at the end of the gaseous crystal growth. A similar situation occurs in case the crystal growth is faster in a direction B as shown in FIG. 2C.

In the conventional method, therefore, a sufficiently high precision of alignment is difficult to achieve, because the alignment pattern changes the form by the gaseous crystal growth.

Because recent semiconductor manufacturing apparatus perform alignment automatically, the above-mentioned change in the alignment pattern may disturb the function of said apparatus. Such a situation not only lowers the yield of the semiconductor devices to be produced but also exerts great influence on the mass production, elevating the cost thereof. The above-mentioned technical problem has to be solved in order to achieve commercial success in the production.

SUMMARY OF THE INVENTION

An object of the present invention is to solve the above-mentioned problems and to provide a method for producing a semiconductor device capable of achieving exact alignment.

Another object of the present invention is to provide a method for producing a semiconductor device containing steps of forming a step with a desired pattern on the surface of a semiconductor substrate and forming a gaseous grown crystal layer thereon, which comprises positioning an alignment pattern, included in said pattern, diagonally with respect to an in-plane direction of faster growth of said pattern in the gaseous crystal growth.

The above-mentioned objects can be achieved, according to an embodiment of the present invention, by forming a stepped pattern on the substrate so as to form an angle less than 90° with respect to the direction of faster crystal growth, and effecting the alignment of the substrate utilizing, as the reference, a step appearing on the surface of a crystal layer grown on the substrate, corresponding to the above-mentioned stepped pattern. Said angle is preferably in the vicinity of 45°.

BRIEF DESCRIPTION OF THE DRAWINGS

FIGS. 2A to 2C are schematic views showing the change in patterns in the conventional method.

DETAILED DESCRIPTION OF THE PREFERRED EMBODIMENTS

Now the present invention will be clarified in detail by an embodiment thereof shown in the attached drawings.

In this embodiment, the stepped pattern is formed in the same manner as shown in FIGS. 1A to 1D.

Figure 1A:
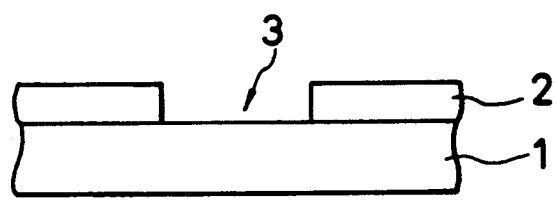
FIGS. 1A to 1D are schematic views showing steps for forming an embedded layer in a semiconductor substrate.

At first, on a surface with an orientation (100) or a p-type semiconductor (Si) substrate 1 of a specific resistivity of 10-20 Ω·cm, a $SiO_2$ film 2 of a thickness of 0.5-2.0 μm is formed over the entire area, and a photoresist layer is formed thereon. Then said photoresist layer is patterned to obtain a mask pattern, and the thus exposed portion of the $SiO_2$ film is removed with HF wet etching, whereby an aperture 3 is formed in the $SiO_2$ film 2 at a desired position for forming an embedded layer as shown in FIG. 1A.

Figure 1B:
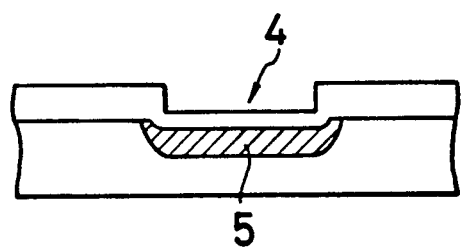

Then, in order to obtain n-type conductivity, the semiconductor substrate 1 is subjected, in the exposed surface thereof, to doping by implantation of As ions as impurity component, and then to heat treatment in an oxidative atmosphere. The ion implantation is conducted with a dose of $1 \times 10^{14} - 1 \times 10^{16}/cm^2$ and an accelerating voltage of 30-90 keV, while the heat treatment is conducted at a temperature of 900°-1200° C. Thus, as shown in FIG. 1B, the exposed surface of the semiconductor substrate 1 is oxidized as a new $SiO_2$ film 4, and a high impurity concentration area 5 is formed thereunder.

Figure 1C:
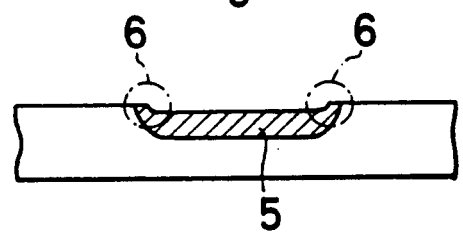

Then said $SiO_2$ films 2 and 4 are removed by HF wet etching, whereby, as shown in FIG. 1C, a step 6 is formed on the surface of the semiconductor substrate 1, at the boundary between said high impurity concentration area 5 and the other area.

Figure 1D:
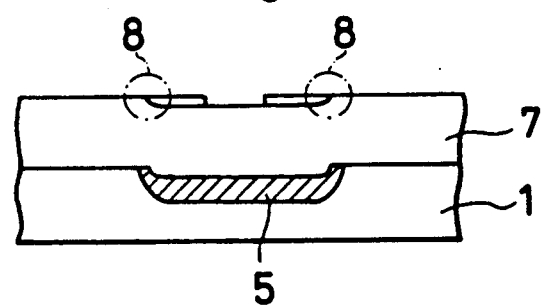

Subsequently, epitaxial growth is conducted over the entire surface, with gases of $SiHCl_2$, $SiCl_4$ or $SiH_2Cl_2$; a temperature of 950° C.-1150° C., a pressure from atmospheric pressure to 50 Torr. and a growth speed of 0.1 to 1.5 μm/min. whereby a gaseous grown crystal layer 7 is formed on the semiconductor substrate as shown in FIG. 1D. The surface of said crystal layer has a step 8 corresponding to the step 6 on the surface of said substrate 1.

Therefore, an embedded layer of low resistivity is formed in this manner, composed of the high impurity concentration area 5. Now reference is made to FIGS. 3A to 3C for explaining the features of the present invention.

Figure 3A:
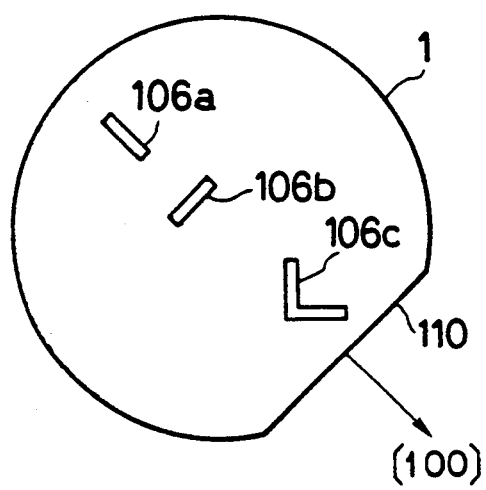
FIGS. 3A to 3C are schematic views showing the change in patterns in the method of the present invention.
Figure 3B:
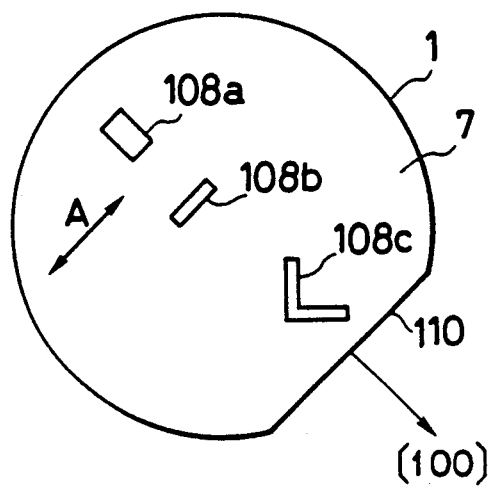
Figure 3C:
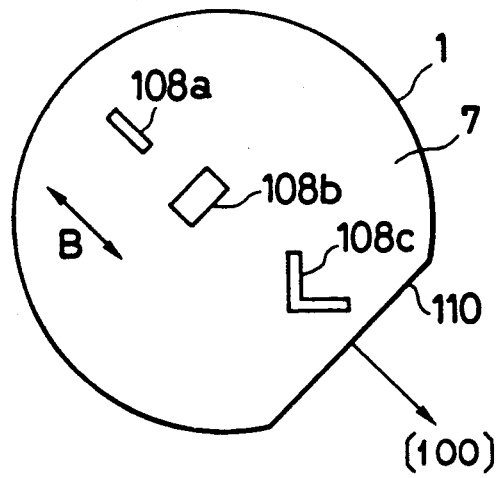

FIG. 3A is a plan view of a semiconductor substrate in a state corresponding to FIG. 1C, while FIGS. 3B and 3C are plan views of the semiconductor substrate in a state corresponding to FIG. 1D.

In the present embodiment, as shown in FIGS. 3A to 3C, the silicon substrate 1 has an orientation flat (110) formed in a direction [100]. There are shown stepped patterns 106a, 106b relating to functional parts of a semiconductor device, and an alignment composed of two linear portions which are substantially in 45° to the normal line to said orientation flat.

In the gaseous crystal growth, the growth of pattern is faster in a direction [100] or [010], and the direction of faster growth is determined by the growth conditions. Thus, if the pattern growth is faster in a direction A as shown in FIG. 3B, in the gaseous growth of the crystal layer 107, the pattern width in one of said functional portions gradually increases so that the step 108a formed on the surface of the crystal layer 107 at the end of gaseous crystal growth does not exactly correspond to the above-mentioned step 106a. On the other hand, the width of the other functional portion and of the alignment pattern scarcely changes, so that the steps 108b, 108c formed on the surface of said crystal layer 107 at the end of gaseous crystal growth exactly correspond to the above-mentioned steps 106b, 106c. Also if the pattern growth is faster in a direction B as shown in FIG. 3C, in the gaseous crystal growth of the crystal layer 107, the pattern width in one of said functional portions gradually increases so that the step 108b formed on the surface of the crystal layer 107 at the end of gaseous crystal growth does not exactly correspond to the above-mentioned step 106b. On the other hand, the width of the other functional portion and of the alignment pattern scarcely changes, so that the steps 108a, 108c formed on the surface of the crystal layer 107 at the end of gaseous crystal growth exactly correspond to the above-mentioned steps 106a, 106c.

Consequently, the present embodiment serves to sufficiently improve the precision of the alignment, for example to an error of 1μm or less.

In order to further improve this effect, it is preferable to slightly incline the surface of the semiconductor substrate with respect to the crystalline plane, for example, substantially by about 4°.

A comparison in the carrier mobility was made, between a semiconductor device obtained when the surface of the semiconductor substrate is inclined with respect to the crystalline plane and is provided with an orientation flat in a direction [100], and a conventional device obtained when the semiconductor substrate is not inclined with respect to the crystalline plane and is provided with an orientation flat in a direction [110]. Said comparison was conducted by forming an n-MOS transistor with a poly-Si gate on each substrate. The result of comparison is shown in FIG. 1.

TABLE 1

| W/L (μm) | Mobility ($cm^2/Vsec$) | |
|---|---|---|
| | Embodiment of this invention | Reference Example |
| 50/50 | 589 | 619 |
| 50/3 | 597 | 609 |
| 12/3 | 604 | 617 |
| Average | 596 | 615 |

As will be apparent from Tab. 1, the semiconductor device produced according to the embodiment of the present invention is sufficiently usable, as the mobility thereof is scarcely reduced in comparison with that in the conventional method.

The foregoing embodiment is limited to the formation of a step at the formation of an embedded layer, but the present invention is likewise applicable to the case of step formation on the surface of the semiconductor substrate by other methods.

Also in the method of the present invention, the step formation can be achieved by forming a mask of the desired pattern on the surface of a semiconductor substrate, then effecting thermal diffusion and thermal treatment, and removing the oxide film formed by said thermal treatment.

It is also possible to employ an n-type substrate and to use, as the impurity, an element of the group III of the periodic table, such as B, instead of As.

As detailedly explained in the foregoing, an alignment step pattern formed on the surface of the semiconductor substrate is positioned diagonally with respect to an in-plane direction of faster pattern growth in the gaseous crystal growth, so that the present invention enables the formation of a step pattern, on the surface of the gaseous grown crystal layer, exactly corresponding to said alignment step pattern, thereby allowing satisfactory alignment between various patterns formed prior to the gaseous crystal growth and those formed thereafter.

What is claimed is:

1. A method for producing a semiconductor device comprising:
   (i) preparing a semiconductor wafer having an isotropic crystal growth speed as a semiconductor substrate, said semiconductor wafer has a (100) orientation flat;
   (ii) forming a desired pattern of an embedded layer on surface of said semiconductor wafer;
   (iii) forming a stepped pattern on the surface of said wafer such that at least one of the edges of said stepped pattern forms an angle less than 90° with respect to a direction of faster crystal growth of said wafer;
   (iv) growing an epitaxial layer on said wafer; and
   (v) effecting the alignment of said semiconductor wafer utilizing, as a reference, a step appearing on the surface of said epitaxial layer whereby the semiconductor device having a semiconductor substrate, an embedded layer and a epitaxial layer is formed.

2. A method for producing a semiconductor device according to claim 1, wherein the angle is equal or close to 45°.

3. A method for producing a semiconductor device according to claim 1, wherein the step of forming a desired pattern on said embedded layer is conducted by:
   (i) forming a mask of a desired pattern on the surface of said semiconductor substrate thereby forming an exposed surface for forming said embedded layer;
   (ii) ion implanting said exposed surface or conducting thermal diffusion to obtain n-type conductivity in said semiconductor substrate;
   (iii) applying a heat treatment to said exposed area in an oxidative atmosphere thereby forming an oxidized film on said exposed area; and
   (iv) removing said oxidized film formed during said heat treatment.

* * * * *

UNITED STATES PATENT AND TRADEMARK OFFICE
CERTIFICATE OF CORRECTION

PATENT NO. : 5,192,680

DATED : March 9, 1993

INVENTOR(S) : YASUHIRO NARUSE, ET AL.

It is certified that error appears in the above-identified patent and that said Letters Patent is hereby corrected as shown below:

COLUMN 1

Line 16, "(100)" should read --[100]--.

COLUMN 2

Line 12, "(110) surface" should read --surface with an orientation [110]--.

COLUMN 3

Line 22, "(100)" should read --[100]--.
Line 68, "(110)" should read --[110]--.

COLUMN 4

Line 3, "alignment composed" should read --alignment pattern 106c. Said alignment pattern 106c is L-shaped composed--.
Line 6, "of" should read --of the--.

UNITED STATES PATENT AND TRADEMARK OFFICE
CERTIFICATE OF CORRECTION

PATENT NO. : 5,192,680
DATED : March 9, 1993
INVENTOR(S) : YASUHIRO NARUSE, ET AL.

It is certified that error appears in the above-identified patent and that said Letters Patent is hereby corrected as shown below:

COLUMN 6

Line 13, "a" should read --an--.

Signed and Sealed this

Eighteenth Day of January, 1994

Attest:

BRUCE LEHMAN

Attesting Officer

Commissioner of Patents and Trademarks